US006392327B1

(12) United States Patent
Lewis et al.

(10) Patent No.: US 6,392,327 B1
(45) Date of Patent: May 21, 2002

(54) SONIC TRANSDUCER AND FEEDBACK CONTROL METHOD THEREOF

(75) Inventors: Douglas L. Lewis, St. Paul Park, MN (US); Scott Ecelberger, Laurel, MD (US); Eilaz Babaev, Minnetonka; Robert J. Wojciechowski, Cottage Grove, both of MN (US); Ashok Kumar, Cupertino, CA (US); Jian Ruan, Maplewood; Manish Kochar, Lino Lakes, both of MN (US)

(73) Assignee: James L. Sackrison, Minnetonka, MN (US)

( * ) Notice: Subject to any disclaimer, the term of this patent is extended or adjusted under 35 U.S.C. 154(b) by 0 days.

(21) Appl. No.: 09/537,349

(22) Filed: Mar. 29, 2000

(51) Int. Cl.[7] .................... H01L 41/08

(52) U.S. Cl. .................... 310/316.01; 310/323.01; 310/354

(58) Field of Search .................... 310/316.01, 316.02, 310/328, 354, 323.21, 366

(56) References Cited

U.S. PATENT DOCUMENTS

| | | | | | |
|---|---|---|---|---|---|
| 3,736,523 A | | 5/1973 | Puskas | 331/64 |
| 3,889,166 A | | 6/1975 | Scurlock | 318/116 |
| 4,197,478 A | | 4/1980 | Silvus, Jr. | 310/316 |
| 4,264,838 A | | 4/1981 | Jacobson | 310/329 |
| 4,275,388 A | | 6/1981 | Hornung | 340/384 |
| 4,378,510 A | | 3/1983 | Bennett | 310/329 |
| 4,441,044 A | | 4/1984 | Ruckenbauer et al. | 310/338 |
| 4,453,141 A | | 6/1984 | Rosati | 331/158 |
| 4,479,388 A | | 10/1984 | Matzuk | 73/634 |
| 4,491,759 A | * | 1/1985 | Kunz et al. | 310/328 |
| 4,506,184 A | * | 3/1985 | Siddall | 310/328 |
| 4,608,865 A | | 9/1986 | Muller et al. | 73/204 |
| 4,728,843 A | | 3/1988 | Mishiro | 310/325 |
| 4,739,860 A | | 4/1988 | Kobayashi et al. | 181/123 |
| 4,893,045 A | | 1/1990 | Honda | 310/323 |
| 4,979,952 A | | 12/1990 | Kubota et al. | 606/169 |
| 4,982,725 A | * | 1/1991 | Hibino et al. | 128/4 |
| 5,099,815 A | * | 3/1992 | Yamauchi et al. | 123/472 |
| 5,176,140 A | | 1/1993 | Kami et al. | 128/662.03 |
| 5,209,119 A | | 5/1993 | Polla et al. | 73/723 |
| 5,216,631 A | | 6/1993 | Sliwa, Jr. | 365/174 |
| 5,286,452 A | | 2/1994 | Hansen | 422/73 |
| 5,336,958 A | * | 8/1994 | Saya et al. | 310/316.01 |
| 5,390,678 A | | 2/1995 | Gesswein et al. | 128/662.06 |
| 5,447,509 A | | 9/1995 | Mills et al. | 606/1 |
| 5,465,109 A | * | 11/1995 | Bowers | 347/74 |
| 5,515,341 A | | 5/1996 | Toda et al. | 367/140 |
| 5,536,963 A | | 7/1996 | Polla | 257/417 |
| 5,589,401 A | | 12/1996 | Hansen et al. | 436/525 |

(List continued on next page.)

FOREIGN PATENT DOCUMENTS

| | | | | |
|---|---|---|---|---|
| GB | 1 359 701 | | 7/1974 | H01V/7/00 |
| JP | 10-148533 A | * | 6/1998 | 310/366 |

OTHER PUBLICATIONS

"Copalis Technology", by A. Bodner et al., *Immunoassay Automation: An Updated Guide To Systems*, pp. 253–275, (1996).

Pamphlet entitled "Patient–Centered Diagnostics™,Multiplex ™ Testing and Copalis™", by DiaSorin Inc., Stillwater, Minnesota (1999).

*Primary Examiner*—Thomas M. Dougherty
(74) *Attorney, Agent, or Firm*—Westman, Champlin & Kelly, P.A.

(57) ABSTRACT

A sonic transducer includes a transducer body and a drive element coupled to the transducer body to produce a sonic output in response to an applied electrical input. A sense element is coupled to the sonic drive element and is configured to provide an electrical feedback output related to the sonic output. The electrical feedback output is adapted to be used to control the applied electrical input to the sonic drive element so as to control the energy delivered to the working area or tip of the transducer.

19 Claims, 7 Drawing Sheets

U.S. PATENT DOCUMENTS

| | | | | | |
|---|---|---|---|---|---|
| 5,661,361 | A | | 8/1997 | Lysen | 310/329 |
| 5,671,154 | A | | 9/1997 | Iizuka et al. | 364/507 |
| 5,777,230 | A | | 7/1998 | Vandervalk | 73/632 |
| 5,808,737 | A | | 9/1998 | Edens et al. | 356/246 |
| 5,858,648 | A | | 1/1999 | Steel et al. | 435/5 |
| 5,865,946 | A | | 2/1999 | Råbe | 156/580 |
| 5,869,762 | A | | 2/1999 | Corsaro et al. | 73/514.34 |
| 5,869,764 | A | | 2/1999 | Schulte | 73/620 |
| 5,906,580 | A | | 5/1999 | Kline-Schoder et al. | 600/459 |
| 5,907,521 | A | | 5/1999 | Matsui et al. | 367/162 |
| 5,909,279 | A | | 6/1999 | Pepper et al. | 356/345 |
| 5,914,507 | A | | 6/1999 | Polla et al. | 257/254 |
| 5,924,993 | A | | 7/1999 | Hadjicostis et al. | 600/462 |
| 6,144,140 | A | * | 11/2000 | Iino et al. | 310/316.02 |
| 6,191,520 | B1 | * | 2/2001 | Maruyama et al. | 310/323.06 |

* cited by examiner

SONIC TRANSDUCER AND FEEDBACK CONTROL METHOD THEREOF

BACKGROUND OF THE INVENTION

The present invention relates to transducers of the type used to produce a sonic output. More specifically, the present invention relates to controlling the sonic output from a transducer using a feedback technique.

Sonic transducers, and in particular ultrasonic transducers, are used in a wide variety of applications to provide a sonic output. For example, ultrasonic transducers are used for imaging, medical therapy, motors, sonar systems, welding, cleaning, instrumentation, chemical activation, machining and vaporizing. One example use in the medical field is in the Copalis® testing system available from DiaSorin Inc. of Stillwater, Minn. In the Copalis® testing system, an ultrasonic transducer is used for resuspension of particles in a fluid.

One problem commonly associated with ultrasonic transducers is the inability to accurately control the energy delivered by the ultrasonic transducer. This is largely due to the inability to accurately determine the energy level of the ultrasonic output provided by a drive element in the transducer. This has made it difficult to accurately ascertain whether the ultrasonic transducer is providing the desired level of ultrasonic energy to the work piece.

One technique used to overcome the problem of controlling the output is to accurately calibrate the transducer prior to use. However, the output energy level is dependent upon a number of different factors and can experience drift during operation. For example, a change in the force applied to the transducer can affect the energy output. The delivered energy level is also affected by factors such as drive voltage, ambient temperature, temperature rise due to self heating of the transducer during operation, and a change in the resonant frequency of the transducer. This problem is exacerbated because the ultrasonic transducer must operate in the stable and desired frequency regimes in order to operate efficiently.

One technique for automatically controlling the drive signal frequency applied to an ultrasonic transducer is to compare the phase of the drive voltage signal to the phase of the drive current signal. When the voltage and current signals are in phase, the ultrasonic transducer is operating at a resonant frequency. However, this technique is complex, inefficient, and does not provide a direct indication of the amount of energy in the ultrasonic transducer. Another technique is to use a separate sensor spaced apart from the ultrasonic transducer to monitor the energy output. However, this technique is sensitive to standing waves which may cause inaccurate readings. Further, this technique can be inaccurate due to interfacial changes between materials.

Other techniques of controlling the transducer use a sense element to determine if the transducer is operating at resonance. Such techniques are described in, for example, U.S. Pat. No. 3,889,166, issued Jun. 10, 1975, and entitled AUTOMATIC FREQUENCY CONTROL FOR A SANDWICH TRANSDUCER USING VOLTAGE FEEDBACK; U.S. Pat. No. 4,197,478, issued Apr. 8, 1980, and entitled ELECTRONICALLY TUNABLE RESONANT ACCELEROMETER; U.S. Pat. No. 4,728,843, issued Mar. 1, 1988, and entitled ULTRASONIC VIBRATOR AND DRIVE CONTROL METHOD THEREOF; U.S. Pat. No. 4,441,044, issued Apr. 3, 1984, and entitled TRANSDUCER WITH A PIEZOELECTRIC SENSOR ELEMENT; and U.S. Pat. No. 5,536,963, issued Jul. 16, 1996, and entitled MICRODE- VICE WITH FERROELECTRIC FOR SENSING OR APPLYING A FORCE. Although above mentioned techniques describe the use of a separate sense element to detect if the transducer is operating at a mechanical resonant frequency, these techniques have not monitored and controlled the energy level of the transducer.

SUMMARY OF THE INVENTION

A sonic transducer includes a transducer body and a sonic drive element coupled to the transducer body to produce a sonic output in response to an applied electrical input. An electromechanical transducer such as a sonic transducer includes a transducer body and an electromechanical drive element coupled to the transducer body to produce an electromechanical output, such as a sonic output in response to an applied electrical input. A sense element is coupled to the drive element and is configured to provide an electrical feedback output related to the electromechanical output. The electrical feedback output is adapted to be used to control the applied electrical input to the drive element.

DETAILED DESCRIPTION OF THE ILLUSTRATIVE EMBODIMENTS

Figure 1:
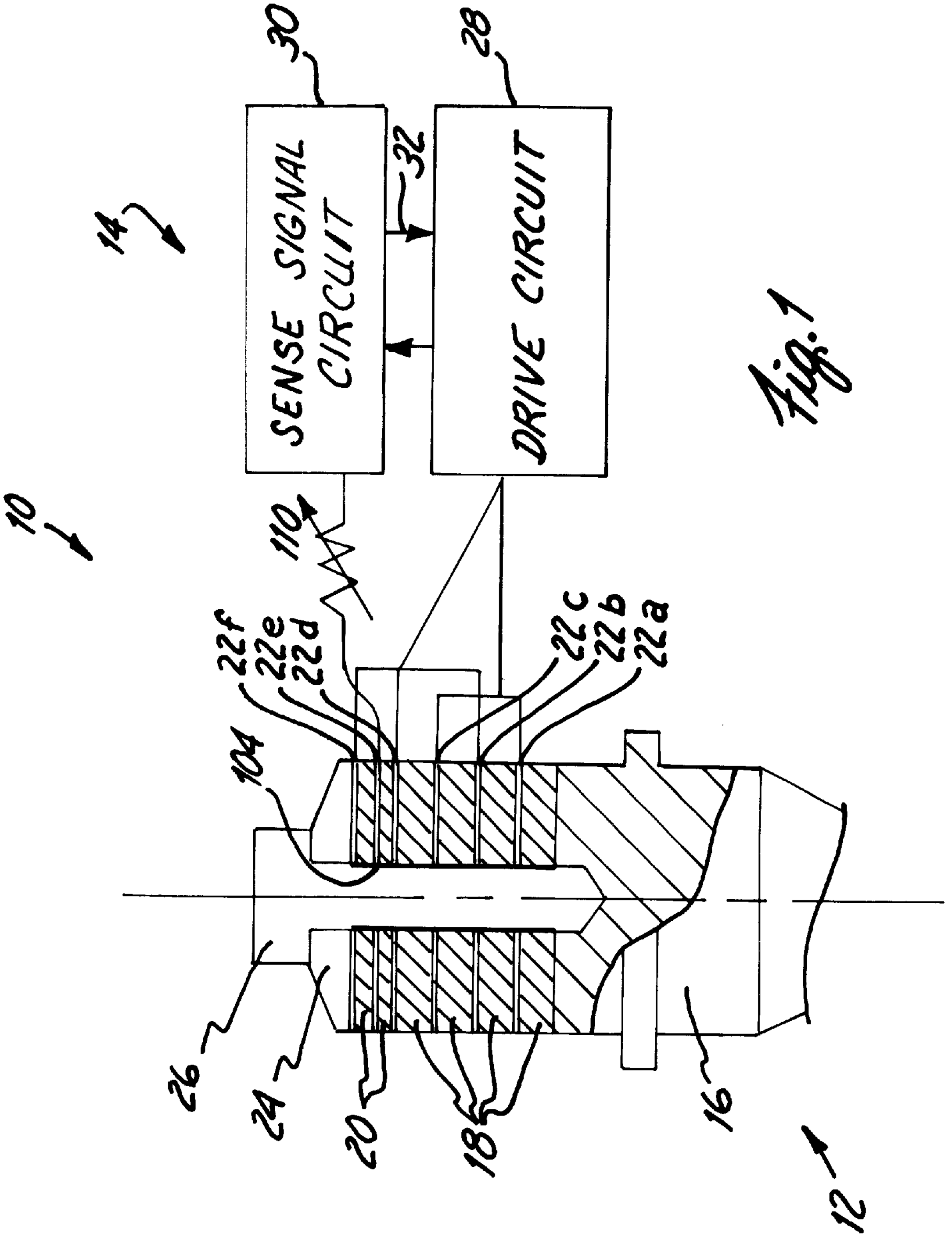
FIG. 1 is a side cutaway view showing a transducer system in accordance with one embodiment of the present invention.

FIG. 1 is a simplified diagram of a system 10 which includes a transducer 12 in accordance with one embodiment of the present invention coupled to electronics 14. FIG. 1 shows a side cutaway view of transducer 12 which includes a transducer body 16, drive elements 18 and sense elements 20. Electrodes 22*a*–22*f* are sandwiched between adjacent elements 18 or 20 to form a stack of separated elements as shown in FIG. 1. A backing plate 24 is attached to the transducer body 16 using screw 26 to thereby compress elements 18 and 20.

In one preferred embodiment, elements 18 and 20 are comprised of piezoelectric materials, however any appropriate drive or sense element may be used in accordance with the invention. Drive elements 18 are electrically coupled to drive circuitry 28 through electrodes 22*a* and 22*c*. Electrode 22*b* provides an electrical ground. Drive circuitry 28 applies an electrical input to drive elements 18 to thereby produce a output which is transferred to transducer body 16. Sense elements 20 couple to sense signal circuitry 30 through electrical contact 22*e*. The output from electrical contact 22*e* is an electrical feedback signal which is used by sense signal circuit to provide a control signal 32 to drive circuit 28 to maintain desired output.

The drive elements 18 can be any material which exhibits a piezoelectric effect. The drive elements 18 are excited by an applied electrical input provided by drive circuit 28 to produce a mechanical displacement that transforms into the sonic output. Typically, the electrical input includes an AC component having a frequency related to a desired output frequency from the transducer 12. The sense elements 20 also use a piezoelectric effect to generate a separate and distinct electrical output signal in response to the mechanical displacement from the drive elements 18. Any changes in the operational characteristics of the drive elements 18 which produces a change in the mechanical displacement or resultant sonic output (such as changes due to temperature variations, loading, stress, cracking or electrical inputs) are sensed by sense elements 20 which provide an electrical feedback output to sense signal circuit 30. This output is typically a voltage proportional to the displacement of the sense elements 20 and of the transducer 12 and transducer working area 102.

The voltage output from the sense elements 20 is used by the drive circuitry 28 to provide power or frequency compensation to the drive signal to thereby obtain the desired mechanical displacement and resultant sonic output in the transducer 12. Additionally, the voltage output from the sense elements 20 can be used to provide diagnostic or monitoring information regarding the operation and environment of transducer 12 and transducer working area 102.

Circuits 28 and 30 can be implemented in analog or digital circuitry, or their combination, and used to provide continuous or discrete monitoring and adjustment of the drive output to maintain the desired mechanical displacement of the transducer 12 and resultant sonic output. In one preferred embodiment, a digital processor periodically monitors the output from the sense elements 20 to adjust the output from the drive circuit 28 on a substantially real time basis. In such an embodiment, software can be utilized to calibrate the transducer 12 for the use of similar or dissimilar materials between the various elements 18 and 20.

Figure 2:
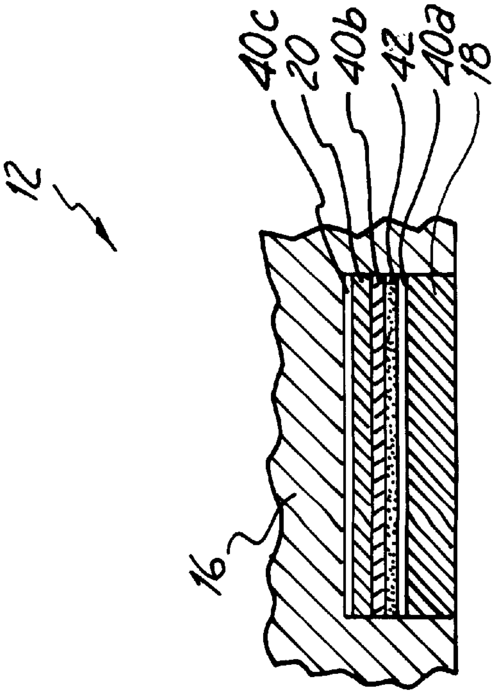
FIG. 2 is a side cross-sectional view of one embodiment of a transducer for use in the system of FIG. 1.

FIG. 2 is a cross-sectional view showing another embodiment of transducer 12 having a single drive element 18 and a single sense element 20 in transducer body 16. A drive electrode 40*a* is positioned in contact with drive element 18 and separated from a sense element electrode 40*b* by insulator 42. Sense element electrode 40*b* electrically couples to sense element 20. A common electrical connection is provided through electrode 40*c*.

Figure 3:
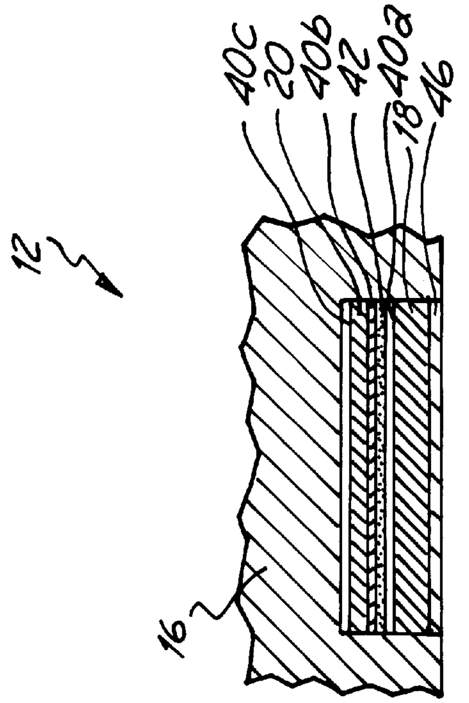
FIG. 3 is a side cross-sectional view of one embodiment of a transducer for use in the system of FIG. 1.

FIG. 3 is a side cross-sectional view of another embodiment of transducer 12. The embodiment of FIG. 3 is similar to the embodiment of FIG. 2 except that an extra membrane ground electrode 46 is provided which couples to drive element 18. Note that the embodiment shown in FIGS. 2 and 3 do not include a fastener such as screw 26 shown in FIG. 1 which is an optional component in all embodiments.

Figure 5:
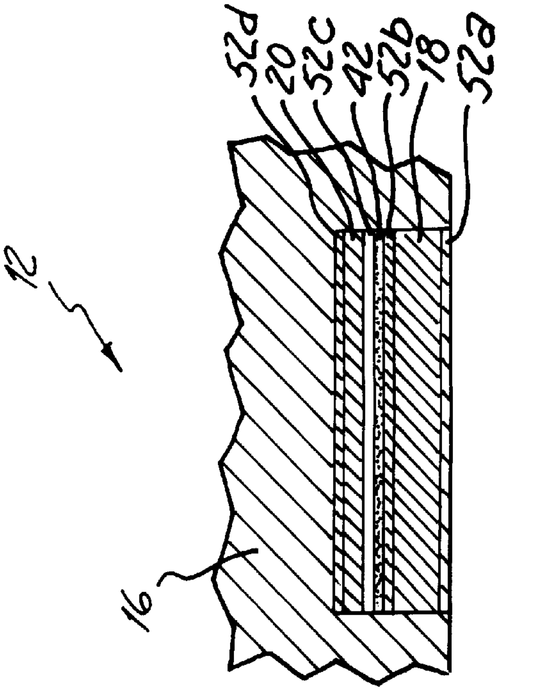
FIG. 5 is a side cross-sectional view of one embodiment of a transducer for use in the system of FIG. 1.
Figure 4:
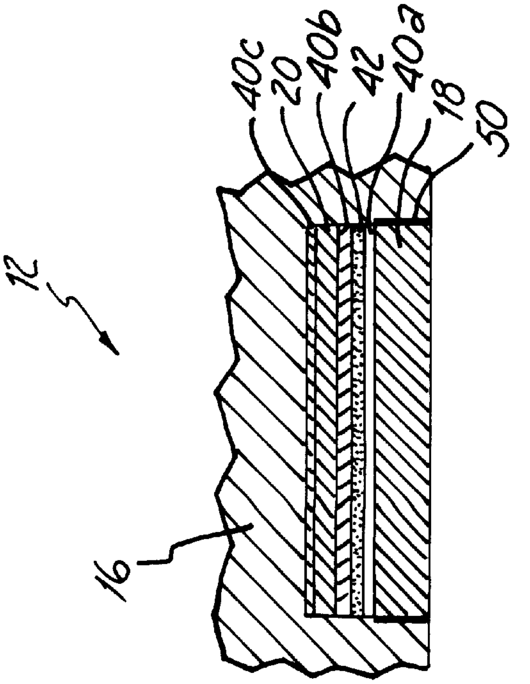
FIG. 4 is a side cross-sectional view of one embodiment of a transducer for use in the system of FIG. 1.

FIG. 4 shows another embodiment of transducer 12. In the embodiment of FIG. 4, a ground electrode 50 has been added to provide electrical grounding to the structure. The embodiment of transducer 12 in FIG. 5 is slightly different in that a drive electrode 52A, drive return 52B, sense electrode 52C and sense return 52D have been added to the structure to provide independent electrical coupling to drive element 18 and sense element 20. Of course, these embodiments are simply shown to illustrate various aspects of the invention and the invention is not limited to any particular drive or sense element configuration. Additional sense elements can be connected in series or in parallel to increase the amplitude and/or frequency sensitivity of the sensor or to increase the output signal from the sense element. The sense elements may be interspersed or distributed among the various drive elements to provide distributed feedback indicative of operation of transducer 12. The thickness of the sonic elements 20 may be less than, equal to or greater than the thickness of the drive elements.

Figure 6C:
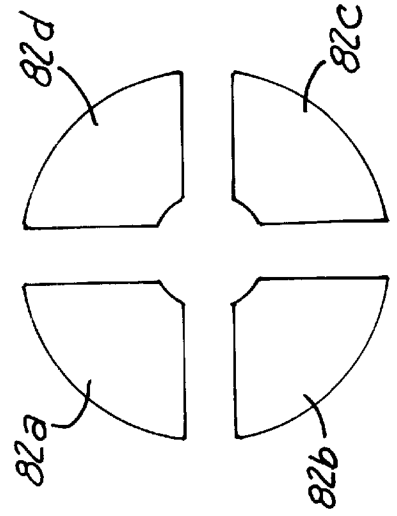
FIGS. 6A, 6B and 6C are top plan views of example configurations for sense or drive elements for use with an ultrasonic transducer.
Figure 6B:
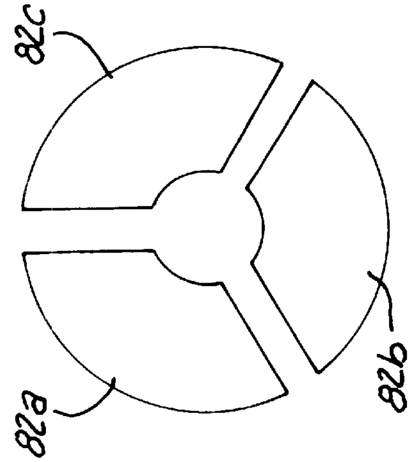
Figure 6A:
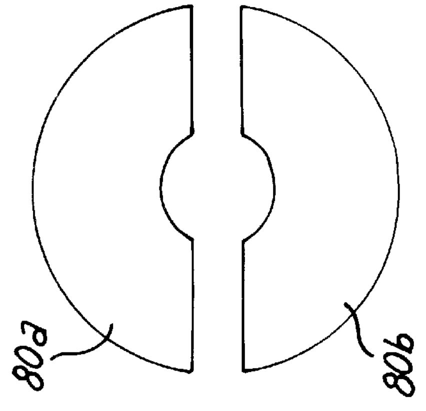

FIGS. 6A, 6B and 6C are top plan views showing three example embodiments for elements 18 and 20. In FIG. 6A a piezoelectric element is shown as two halves 80*a* and 80*b*. In FIG. 6B, the element is shown in three sections, 82*a*, 82*b* and 82*c*. In FIG. 6C an embodiment for an element is shown in which the element is provided in quarter sections 82*a*, 82*b*, 82*c* and 82*d*. In these embodiments, it is the electrode pattern on the element which is segmented to make contact at multiple locations. Of course, any configuration can be used with the present invention including a solid piece. Further, the elements do not require a disc shape as illustrated herein.

In one embodiment, the sense elements 20 and the drive elements 18 are of the same material whereby they experience the same changes due to environmental or other operational variations. The elements 18 and 20 can be of any appropriate material including crystals, plastics, ceramic or others. Such piezoelectric ceramics can be obtained from American Piezo Ceramics of Pennsylvania.

Figure 7:
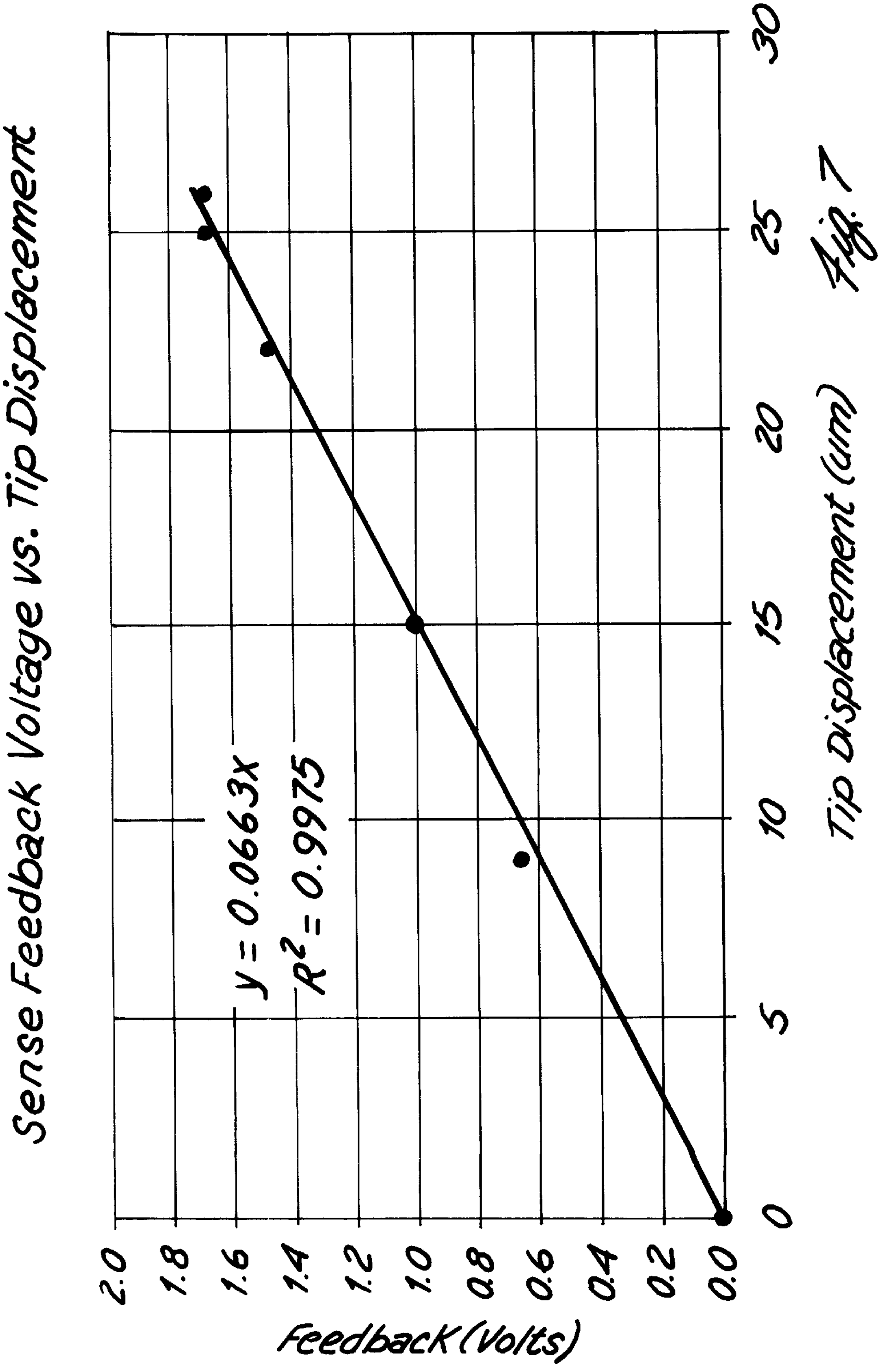
FIG. 7 is a graph of a feedback voltage versus tip amplitude in μm.
Figure 8:
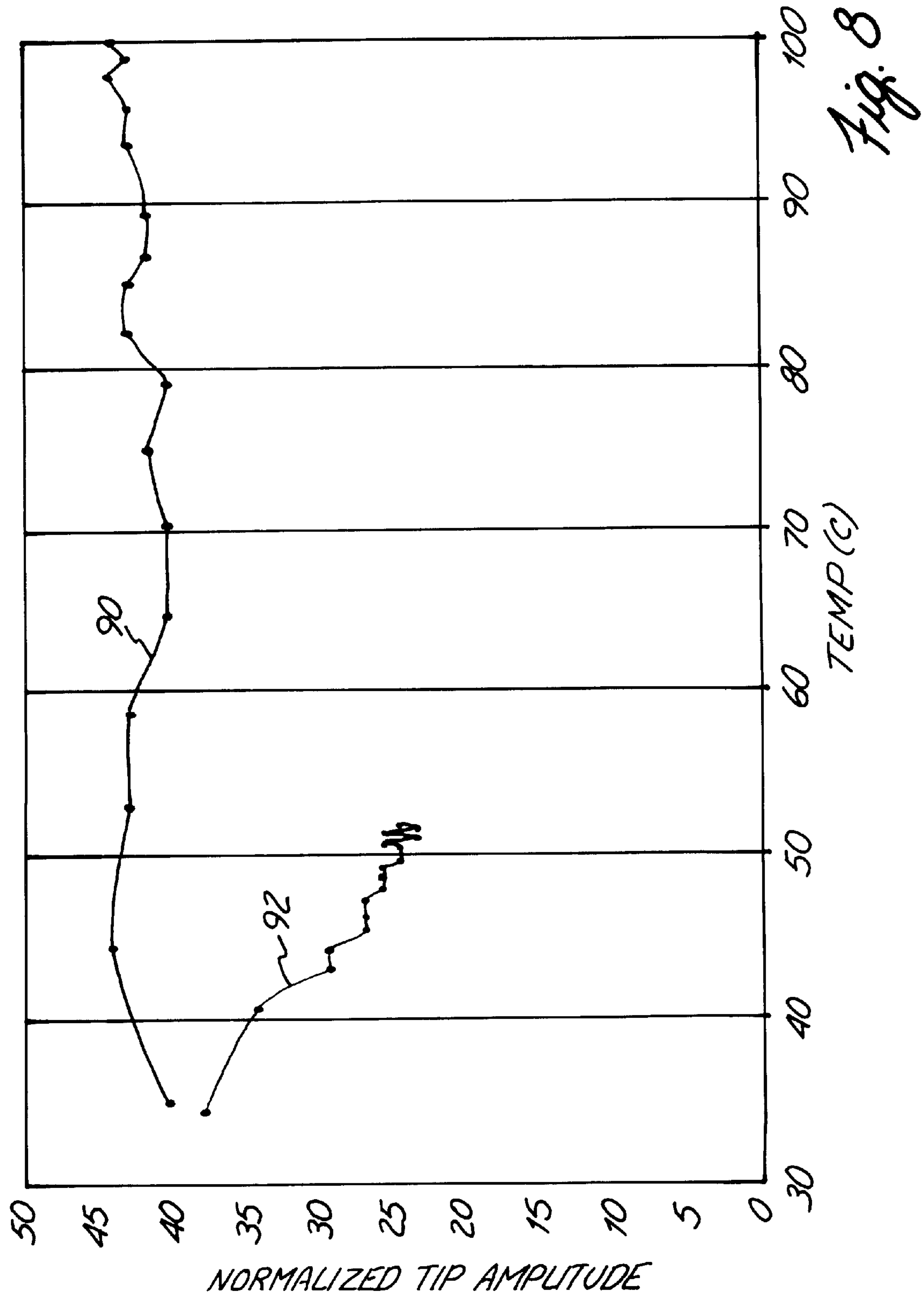
FIG. 8 is a graph of normalized tip amplitude versus temperature for an ultrasonic transducer having feedback control and an ultrasonic transducer having no feedback control.

FIG. 7 is a graph of the tip amplitude (i.e., mechanical displacement) of an ultrasonic transducer of FIG. 1 in $\mu$m versus the feedback voltage (rectified and scaled) output of sense element 20 measured in Volts. FIG. 7 illustrates a highly linear relationship between the feedback voltage output from the sense elements and the tip amplitude. This linear relation provides for excellent control of the drive elements 18 to obtain a desired tip amplitude. Further, this relationship is substantially constant even after extended periods of use or over varying temperature ranges or other environmental factors which could effect the elements. FIG. 8 is a graph of tip amplitude versus temperature for the transducer 12 of FIG. 1 controlled in accordance with the present invention (plot 90) and an uncontrolled sonic probe (plot 92). As illustrated in FIG. 8, the output from the control probe is substantially constant over almost a 70° celsius change in temperature.

Figure 9:
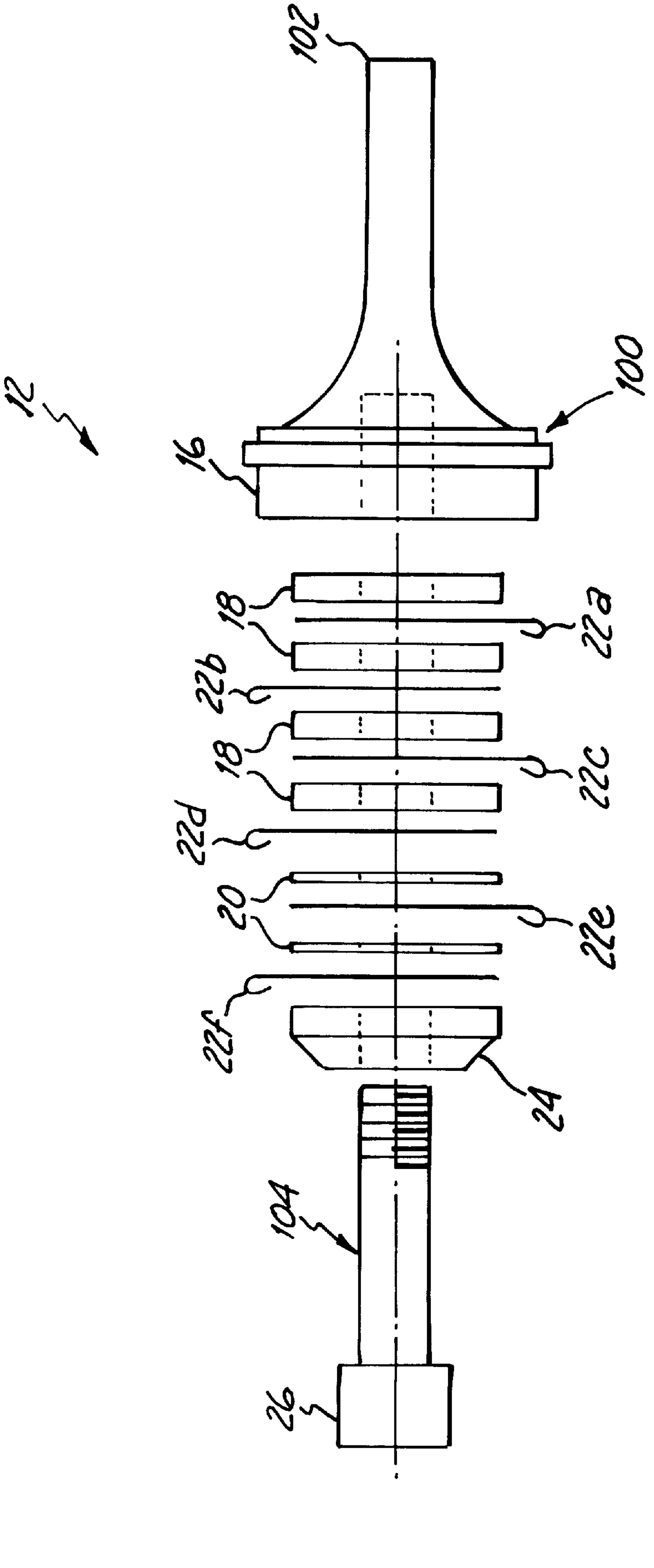
FIG. 9 is an exploded view showing an ultrasonic transducer of FIG. 1 is greater detail.

FIG. 9 is an exploded view showing transducer 12 from FIG. 1 in greater detail. FIG. 9 shows the positioning of contacts 22*a*–22*f* relative to elements 18 and 20. Additionally, in FIG. 9 transducer body 16 forms a horn 100 for amplifying displacement into tip 102. Tip 102 can then be applied to a work piece as desired. Screw 26 includes an insulating cover 104 to prevent electrical shorting of elements 18 and 20 and contacts 22*a*–22*f*.

Referring back to FIG. 1, another aspect of the present invention is illustrated. A variable resistance 110 is shown connected in series with the output from sense elements 20. Variable resistance 110 can be adjusted or calibrated during manufacture such that it is properly matched with sense signal circuit 30 and drive circuit 28 to provide accurate control. This configuration allows a standardized sense signal 30 and drive circuit 28 to be used and individual transducers 12 to be calibrated by adjusting variable resistance 110.

Table 1 shows a comparison of the initial measurements and measurements made after approximately 850,000 sonication cycles using three horns incorporating the sense element feedback of the invention to control the displacement of the tip of the horn of the transducer of FIG. 1. The life cycling is done in air with no load presented to the horn tip.

TABLE 1

| | Horn # | | |
|---|---|---|---|
| | SC5 | SC1 | SC6 |
| Displacement* 2/1/99 | 38 um | 38 um | 38 um |
| Displacement* 8/4/99 | 39 um | 39 um | 40 um |
| Feedback Sense Voltage Test 1 | 2.168 V | 2.129 V | 2.109 V |
| Feedback Sense Voltage Test 2 | 2.129 V | 2.109 V | 2.090 V |

Note:
*The displacement measurement error is +/− 1 um

This data demonstrates that the feedback voltage remains stable and proportional to the displacement of the horn on three horns. As evidenced by above test results, in each series of tests, the system of the present invention provides independent feedback to monitor and control transducer operation.

Although the present invention has been described with reference to preferred embodiments, workers skilled in the art will recognize that changes may be made in form and detail without departing from the spirit and scope of the invention. The invention is not limited to the particular configurations set forth herein. Further, as used herein the term "sonic" includes acoustic, ultrasound and mechanical vibrations. In one embodiment, the present invention is used to produce ultrasonic energy. The invention can be used in any application where controlled sonic waves are desired.

What is claimed is:

1. A device, comprising:

a transducer body;

a drive element coupled to the transducer to produce a sonic output in response to an electrical input;

a sense element coupled to the transducer and coupled to the drive element, the sense element configured to provide an electrical feedback output related to the transducer output, the electrical feedback output adapted to control the electrical input to the drive element; and an electrical insulator which separates and electrically insulates the sense element from the drive element.

2. The device of claim 1 wherein the drive element comprises a piezoelectric element.

3. The device of claim 1 wherein the sense element comprises a piezoelectric element.

4. The device of claim 1 wherein the drive element produces ultrasonic energy.

5. The device of claim 1 including a first electrical contact electrically coupled to the drive element and a second electrical contact electrically coupled to the sense element, the first electrical contact adapted to receive the electrical input and the second electrical element adapted to provide the electrical feedback output.

6. The device of claim 5 including a third electrical contact configured to provide an electrical ground.

7. The device of claim 1 including an adjustable impedance connected in series with the electrical feedback output to calibrate for variations in the device.

8. The device of claim 1 wherein the sense element and drive elements are disc shaped.

9. The device of claim 8 wherein the drive element and sense element include holes extending therethrough.

10. The device of claim 1 including a plurality of drive elements.

11. The device of claim 1 including a plurality of sense elements.

12. The device of claim 1 including a horn having a tip, the horn configured to direct displacement to the tip.

13. The device of claim 1 wherein the electrical feedback output comprises a voltage signal.

14. The device of claim 1 including an end cap and wherein the drive element and sense element are positioned between the transducer body and the end cap.

15. The device of claim 14 wherein a clamping force is applied to the drive element and the sense element by the end cap and the transducer body.

16. The device of claim 1, wherein the drive and sense elements are directly clamped to a working surface and wherein vibrations for the device is transformed to the working surface.

17. The device of claim 1 wherein the sense element comprises a segmented disc.

18. The device of claim 1 wherein the sense element has a thickness which is less than a thickness of the drive element.

19. The device of claim 1 wherein the drive element comprises a segmented disc.

* * * * *